United States Patent [19]

Noguchi et al.

[11] Patent Number: 5,079,513
[45] Date of Patent: Jan. 7, 1992

[54] DEMODULATOR AND RADIO RECEIVER HAVING SUCH A DEMODULATOR

[75] Inventors: Hiroshi Noguchi, Tokyo; Nobuo Tsukamoto, Tachikawa; Arata Nakagoshi, Kokubunji; Atushi Hoshi, Tokyo; Masato Horaguchi, Sendai, all of Japan

[73] Assignees: Hitachi, Ltd., Chiyoda; Kokusai Electric Co., Ltd., Tokyo, both of Japan

[21] Appl. No.: 612,982

[22] Filed: Nov. 15, 1990

[30] Foreign Application Priority Data

Nov. 15, 1989 [JP] Japan .................. 1-295000

[51] Int. Cl.[5] ............................................ H03D 3/00
[52] U.S. Cl. .................................... 329/304; 307/557
[58] Field of Search ............... 329/300, 304; 307/529, 307/552, 557

[56] References Cited

U.S. PATENT DOCUMENTS 4,833,416  5/1989  Attwood .................... 329/304

Primary Examiner—Robert J. Pascal
Attorney, Agent, or Firm—Antonelli, Terry, Stout & Kraus

[57] ABSTRACT

The invention relates to a demodulator and to a radio receiver having such a demodulator and, more particularly, to a demodulator for demodulating signals which were digitized by a direct detecting method in which a circuit scale is small and an electric power consumption is small. Particularly, it is a characteristic that a limiter in the demodulator comprises: a circuit for obtaining absolute values of the digital signals (I signal, Q signal) which are produced from an angle modulated wave and whose phases are mutually orthogonal; a circuit for outputting the sum ($|I|+|Q|$) of the absolute values or the larger one $M(|I|, |Q|)$ of the absolute values; a controller for producing a control signal according to an output of the above circuit; and scalers which change the amplitudes of the first and second digital signals in accordance with the control signal and which are constructed by a plurality of shift registers and adders.

14 Claims, 6 Drawing Sheets

CONTROL SIGNAL

CONTROL SIGNAL

FIG. 10A
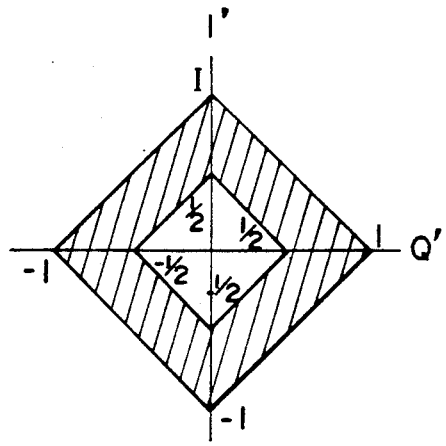
FIG. 10B
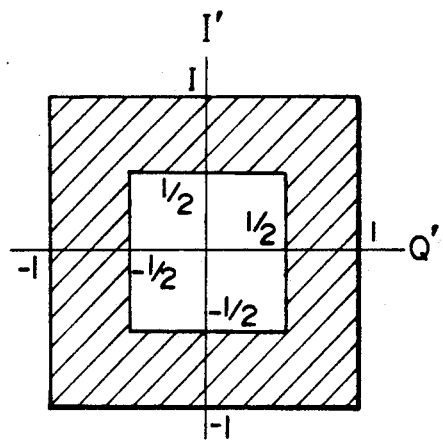
FIG. 11
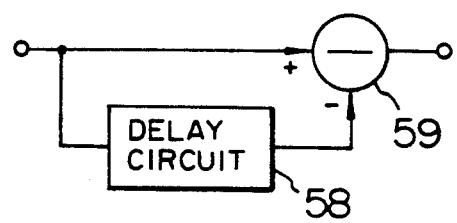
FIG. 12
| I'/Q' POLARITY DETECTOR | | +/+ | +/- | -/+ | -/- |
|---|---|---|---|---|---|
| O(t) | ALGEBRAIC EXPRESSION | DQ − DI | DQ + DI | −DQ − DI | DI − DQ |
| | CIRCUIT A | DQ − DI | DQ−(−DI) | −DQ − DI | −DQ−(−DI) |
| | CIRCUIT B | DQ+(−DI) | DQ + DI | −DQ+(−DI) | −DQ + DI |

DEMODULATOR AND RADIO RECEIVER HAVING SUCH A DEMODULATOR

BACKGROUND OF THE INVENTION

The present invention relates to a demodulator and a radio receiver having such a demodulator and a radio receiver incorporating the same and, more particularly, to a demodulator for digitizing an angle modulated reception signal and, thereafter, for enabling demodulation.

Hitherto, a ceramic discriminator, a quadrature demodulator, or the like has widely been used as a demodulator for detecting a deviation amount of an angle modulated reception input signal from a predetermined center frequency, thereby obtaining a demodulation signal. However, those demodulators need devices such as a ceramic device, inductance device to shift the phase by 90°, and the like which are not suitable to realize an IC. On the other hand, a carrier to be processed is limited to a special frequency. Thus, there is a problem of miniaturization such that the application is limited to a heterodyne receiver or the like.

Therefore, in recent years, attention has been paid to a method of miniaturizing a circuit scale (realizing an IC) by using a direct conversion method as a receiving method whereby after two base band signals (hereinafter, referred to as an I signal and a Q signal) which have the same frequency as that of a reception wave as an input signal or an intermediate frequency wave and whose phases are mutually orthogonal and different by only $\pi/2$ radian were extracted, a channel is selected and a demodulating process is executed and by using a digital demodulator for demodulating the digital signals (I and Q signals) as a demodulator.

An example of the demodulator which is used in the receiver which receives by such a direct detecting method has been disclosed in "DIGITAL RADIO FREQUENCY RECEIVER" of the Official Gazette of International Publication No. WO87/1531.

SUMMARY OF THE INVENTION

FIG. 2 shows a schematic construction of a radio receiver to which the invention is applied.

An angle modulated reception signal R(t) is expressed by the following equation.

$$R(t) = A\cos\{\omega_c t + \theta(t)\} \quad (1)$$

where, $\omega_c$: angle frequency of carrier
$\theta(t)$: modulation signal

An output signal of a local oscillator 14 has an angle frequency which is almost equal to the angle frequency $\omega_c$ of the reception carrier. A distribution phase shifter 15 distributes the output signal of the local oscillator 14 into two signals and, thereafter, converts a phase difference between the two output signals into $\pi/2$ radian. Two output signals LI and LQ of the distribution phase shifter 15 are input to mixers 16 and 17, respectively. Each of the reception signals R(t) is frequently converted. Since the center frequency of a desired reception signal and a local oscillating frequency are almost equal, a desired receiving frequency after completion of the frequency conversion is set to about a few kHz.

Therefore, in the direct detecting method, after the mixers, a digital signal process can be easily applied and it is advantageous to realize an IC. Two A/D converters 18 and 19 convert two output signals of the mixers into digital signals, respectively. Since the output signals of the two mixers 16 and 17 comprise reception signal components of a plurality of channels, in order to select a desired reception wave, frequency bands are limited by digital low pass filters 20 and 21. There is an orthogonal phase relation between the output signals I and Q of the two low pass filters 20 and 21 as shown by the following equations:

$$I(t) = A'\cdot\cos\{\theta(t)\} \quad (2)$$

$$Q(t) = A'\cdot\sin\{\theta(t)\} \quad (3)$$

where, A' denotes an amplitude upon output of the low pass filter. Amplitude limiting processes shown by the following equations are executed in the limiter 1. Output signals of the limiter 1 assume I'(t) and Q'(t).

$$I'(t) = I(t)/\sqrt{I(t)^2 + Q(t)^2} = \cos\{\theta(t)\} \quad (4)$$

$$Q'(t) = Q(t)/\sqrt{I(t)^2 + Q(t)^2} = \sin\{\theta(6)\} \quad (5)$$

A demodulator 2 first obtains differentiated values DI(t) and DQ(t) of the amplitude limited signals I'(t) and Q'(t). The results are shown by the following equations:

$$DI(t) = -\sin\{\theta(t)\}\cdot d\theta/dt \quad (6)$$

$$DQ(t) = \cos\{\theta(t)\}\cdot d\theta/dt \quad (7)$$

Then, the product of DI(t) and Q(t) and the product of DQ(t) and I(t) are obtained. The respective results DI'(t) and DQ'(t) are shown by the following equations.

$$DI'(t) = -\sin^2\{\theta(t)\}\cdot d\theta/dt \quad (8)$$

$$DQ'(t) = \cos^2\{\theta(t)\}\cdot d\theta/dt \quad (9)$$

Finally, by calculating the difference between DQ'(t) and DI'(t), a demodulation output signal O(t) is derived as shown by the following equation.

$$O(t) = DQ'(t) - DI'(t) = d\theta/dt \quad (10)$$

General constructions of the limiter 1 and the demodulator 2 are as shown in FIG. 3. In the limiter 1, the square values of the I signal and Q signal are calculated by square calculators 23 and 24 in accordance with the equations (4) and (5) to obtain I'(t) and Q'(t). The sum of the two squared values is calculated by an adder 25. Further, the square root of the sum as an output signal of the adder 25 is calculated by a square root calculator 26. An I' signal and a Q' signal are obtained by dividing the I signal and Q signal by the value of the square root by two dividers 27 and 28, respectively. In the demodulator 2, the differentiated values of the I' signal and Q' signal are obtained by two differentiators 29 and 30 on the basis of the equations (6) and (7). After that, a DI' signal and a DQ' signal are obtained by two multipliers 31 and 32 on the basis of the equations (8) and (9). Finally, by calculating the difference between the DI' signal and the DQ' signal by a subtracter on the basis of the equation (10), the demodulation output O(t) signal is derived.

Since the divider is a kind of multiplier, if the limiter 1 and the demodulator 2 shown in FIG. 3 are constructed by a dedicated digital circuit instead of a digital processor, a total six multipliers (23, 24, 27, 28, 31, and 32) including the square and the division are necessary. An ordinary multiplier is constructed by a combination of adders. In the case of executing a multiplying process at a high speed, its circuit scale is almost equal to the scale of the circuit in which the number of bits of the data was multiplied to the adder. On the other hand, the differentiator can be constructed by a differential circuit and its component elements are a delay circuit and a subtracter. Since the subtracter is a kind of adder, the demodulator shown in FIG. 3 needs total four adders (26, 29, 30, and 33) including the subtracter. On the other hand, the delay circuit is constructed by a shift register. Further, an inverse calculator and a square root calculator are needed for division.

Although the digital signal processing circuit can be realized as an IC as mentioned above, if it is merely constructed as an IC, its circuit scale increases. On the other hand, even if the circuit stability is improved and the circuit scale can be slightly miniaturized due to the formation of an IC, there is also a possibility such that a disadvantage occurs from a viewpoint of an electric power consumption as compared with the case of an analog signal process. Particularly, in the case of using such a kind of demodulator in a small receiver such as a mobile radio receiver, a large electric power consumption causes a serious drawback.

On the other hand, in the literature of the Official Gazette of International Publication No. WO87/1531, a construction of a demodulator which is simplified to reduce the circuit scale has been disclosed. However, since a multiplier is used in a limiter, the circuit scale is not so sufficiently reduced. On the other hand, since a circuit using an inverse tangent function is used in the demodulator, there is a limitation in miniaturization.

It is a main object of the invention to provide a demodulator of a small circuit scale which is constructed by a digital signal process and also to provide a radio receiver having such a demodulator.

Another object of the invention is to construct limiters in the demodulator and the radio receiver by digital circuits including no multiplier.

To accomplish the above and other objects, according to the invention, a limiter for amplitude limiting each of an I signal and a Q signal as two digital signals which are obtained from an angle modulation wave and have a mutually orthogonal phase relation is constructed by: an absolute value circuit for obtaining absolute values of the I and Q signals; a synthesizer for outputting the sum of the absolute values of the I and Q signals or a larger one of the absolute values of the I and Q signals; a scaler for changing amplitudes of the I and Q signals; and a controller for controlling the scaler by an output of the synthesizer.

As a preferable circuit construction of the absolute value circuit, there is used a circuit for inverting the bit in accordance with the positive or negative sign of each of the input signals for the I and Q signals which are input.

The scaler is constructed by a shift register and an adder for realizing an equation in which an inverse number of the output of the synthesizer is approximately developed to the sum of the values of the powers of 2. The bit shifting process and the addition according to the value of the power are executed to each of the I and Q signals and the resultant I' and Q' signals are used as limiter outputs.

Further, the demodulator is constructed so as to obtain a relative phase rotating direction of the amplitude limited I' and Q' signals and thereby to obtain a demodulation output. Explaining further in detail, a differential value between each of the I' and Q' signals and the data which is preceding by one sampling time is first obtained. Then, the polarity of the differential value of the Q' signal is inverted in accordance with the value of the I' signal. Similarly, the polarity of the differential value of the I' signal is inverted in accordance with the value of the Q' signal. Finally, the difference between the two outputs is obtained and used as a demodulation signal O(t).

Approximate calculations which are needed to understand the practical constructions of the above limiter and demodulator will now be described.

First, the following equations are considered as the first approximation of the approximate calculating equations regarding the limiter.

$$I'(t) = I(t)/(|I(t)| + |Q(t)|) \tag{11}$$

$$Q'(t) = Q(t)/(|I(t)| + |Q(t)|) \tag{12}$$

To accomplish the above equations, two absolute value calculators to obtain $|I(t)|$ and $|Q(t)|$, one adder to add $|I(t)|$ and $|Q(t)|$, and two dividers to execute the divisions of the equations (11) and (12) are fundamentally necessary. Although the absolute value calculator depends on an expressing method of digital data, it can be constructed by a relatively simple circuit. Therefore, the number of constructing elements of the circuit can be reduced.

The following equations are considered as the second approximate equations.

$$I'(t) = I(t)/M(|I(t)|, |Q(t)|) \tag{13}$$

$$Q'(t) = Q(t)/M(|I(t)|, |Q(t)|) \tag{14}$$

where a function M(a,b) denotes that the larger one of a and b is selected. That is, the equations (13) and (14) execute the scaling by the larger one of the two absolute values of the I and Q signals. In this case, two absolute value calculators, two dividers, and one comparator are fundamentally needed.

A points that the limiter which is constructed by the second approximate equation differs from the limiter which is constructed by the first approximate equation is that a comparator is used in place of the adder. Since the comparator comprises a subtracter and a polarity detector, the circuit scale is almost equal.

On the other hand, in the approximate equations (11) to (14), the divider which is necessary generally comprises an inverse calculator and a multiplier. In the invention, an approximate calculation for the division is further executed and the circuit scale is reduced. The divisor in each of the equations (11) to (14) is represented by D and is expressed by a binary number. An inverse number of D is approximated by the sum of the values of the powers of 2 by using the following approximate equations.

$$D \approx 2^{k-1} + A_1 \cdot 2^{k-2} + A_2 \cdot 2^{k-3} + A_3 \cdot 2^{k-4} \tag{15}$$

$$1/D \approx 2^{-k} + (1-A_2) \cdot 2^{-(k+1)} + (1-A_2) \cdot 2^{-(k+2)} + (1-A_3) \cdot 2^{k+3} \tag{16}$$

where, $$2^{k-1} \leq D < 2^k \quad (17)$$

$$D = |I(t)| + |Q(t)| \text{ or } M(|I(t)|, |Q(t)|)$$

The value of A is set to 1 or 0. Therefore, a coefficient $(1-A_x)$ of the calculation of the power of 2 in the equation (16) is set to 1 or 0. The calculations of the equations (11) to (14) are the approximate equation of the equation (16) and the product of the I and Q signals. In the digital signal process, the power of 2 can be accomplished by the bit shift process. Further, since the coefficient is equal to 1 or 0, the limiter has a construction of a combination of a bit shifter and an adder. Therefore, the circuit scale can be further reduced as compared with the approximate calculation using the above divider. On the other hand, by increasing the number of terms of the right side of the equation (16), the calculating accuracy can be raised. Since the circuit scale increases with an increase in number of terms, it is necessary to design the limiter by comparing and considering the calculating accuracy and the limitation of the circuit scale.

On the other hand, the demodulator can be accomplished by the differential operations in the case of constructing a digital signal processing circuit according to the differentiating operations of the equations (6) and (7). Such differential operations are expressed by the following equations with respect to the DI and DQ signals.

$$DI(t) = I'(t) - I'(t-1) \quad (18)$$

$$DQ(t) = Q'(t) - Q'(t-1) \quad (19)$$

Then, as approximate equations of the equations (8) and (9), a DI' signal is obtained by multiplying the polarity of the Q' signal to the DI signal and a DQ' signal is obtained by multiplying the polarity of the I' signal to the DQ signal.

$$DI'(t) = P(Q') \cdot DI(t) \quad (20)$$

$$DQ'(t) = P(I') \cdot DQ(t) \quad (21)$$

where, P(I') corresponds to the polarity of the I' signal and P(Q') corresponds to the polarity of the Q' signal, respectively. If the polarity is positive, +1 is applied. If the polarity is negative, −1 is applied. A difference between the DQ' signal and the DI' signal is calculated and is set to a demodulation signal O(t).

$$O(t) = DQ'(t) - DI'(t) \quad (22)$$

In other words, in accordance with a table shown in FIG. 12, processes for the DI and DQ signals are executed on the basis of the polarities of the I' and Q' signals, thereby obtaining the O signal.

The case where I'(t)>0 and Q'(t)>0 will now be described as an example. It is assumed that the foregoing equations are used with respect to the I and Q signals.

$$\begin{aligned} I'(t) &= I(t)/(I(t) + Q(t)) \\ &= \cos\{\theta(t)\}/D(t) \end{aligned} \quad (23)$$

$$\begin{aligned} Q'(t) &= Q(t)/(|I(t)| + |Q(t)|) \\ &= \sin\{\theta(t)\}/D(t) \end{aligned} \quad (24)$$

$$DI(t) = \cos\{\theta(t)\}/D(t) - \cos\{\theta(t-1)\}/D(t-1) \quad (25)$$

$$DQ(t) = \sin\{\theta(t)\}/D(t) - \sin\{\theta(t-1)\}/D(t-1) \quad (26)$$

$$\begin{aligned} D(t) &= |\cos\{\theta(t)\}| + |\sin\{\theta(t)\})| \\ &= \cos\{\theta(t)\} + \sin\{\theta(t)\} \end{aligned} \quad (27)$$

Now, assuming that $$\theta(t-1) = \theta(t) - \Delta\theta, \ \Delta\theta << 1 \quad (28)$$

we have $$\cos\{\theta(t-1)\} = \cos\{\theta(t-1) - \Delta\theta\} \approx \cos\theta(t) + \sin\{\theta(t)\} \cdot \Delta\theta \quad (29)$$

$$\sin\{\theta(t-1)\} = \sin\{\theta(t-1) - \Delta\theta\} \approx \sin\theta(t) - \cos\{\theta(t)\} \cdot \Delta\theta \quad (30)$$

$$D(t-1) = \cos\{\theta(t)\} + \sin\{\theta(t)\} + [\cos\{\theta(t)\} - \sin\{\theta(t)\}] \cdot \Delta\theta \approx D(t) \quad (31)$$

Therefore, $$Di(t) = -\sin\{\theta(t-1)\} \cdot \Delta\theta/D(t) \quad (32)$$

$$DQ(t) = \cos\{\theta(t)\} \cdot \Delta\theta/D(t) \quad (33)$$

Further, since P(Q') = P(I') = 1 from the above conditions, $$\begin{aligned} O(t) &= DQ'(t) - DI'(t) \\ &= [\cos\{\theta(t)\} - \sin\{\theta(t)\}] \cdot \Delta\theta/D(t) \\ &= \Delta\theta = \theta(t) - \theta(t-1) \\ &= d\theta(t)/dt \end{aligned} \quad (34)$$

The modulating operation can be executed by the above approximating calculations. Even for another combination of the I' and Q' signals, a similar demodulation output O signal can be obtained in accordance with table of FIG. 12. The demodulator of the invention can be constructed by: two differentiators (differential circuits) each having a shift register and a subtracter; level comparators; polarity inverters; and a subtracter. Since no multiplier is used, the circuit scale can be remarkably reduced.

The foregoing and other objects, advantages, manner of operation and novel features of the present invention will be understood from the following detailed description when read in connection with the accompanying drawings.

BRIEF DESCRIPTION OF THE DRAWINGS

FIGS. 10A and 10B are correlation diagrams of two output signals in the case where the sum of the absolute values of an I signal and a Q signal and larger one of the absolute values of the I and Q signals are used as synthetic outputs of the limiter in the embodiment according to the invention;

FIG. 11 is a constructional diagram of a differentiator which is used in an embodiment of the demodulator according to the invention; and FIG. 12 is a relational diagram of processes for output of two differentiators which are used in the embodiment of the demodulator according to the invention.

DESCRIPTION OF THE PREFERRED EMBODIMENTS

Figure 1:
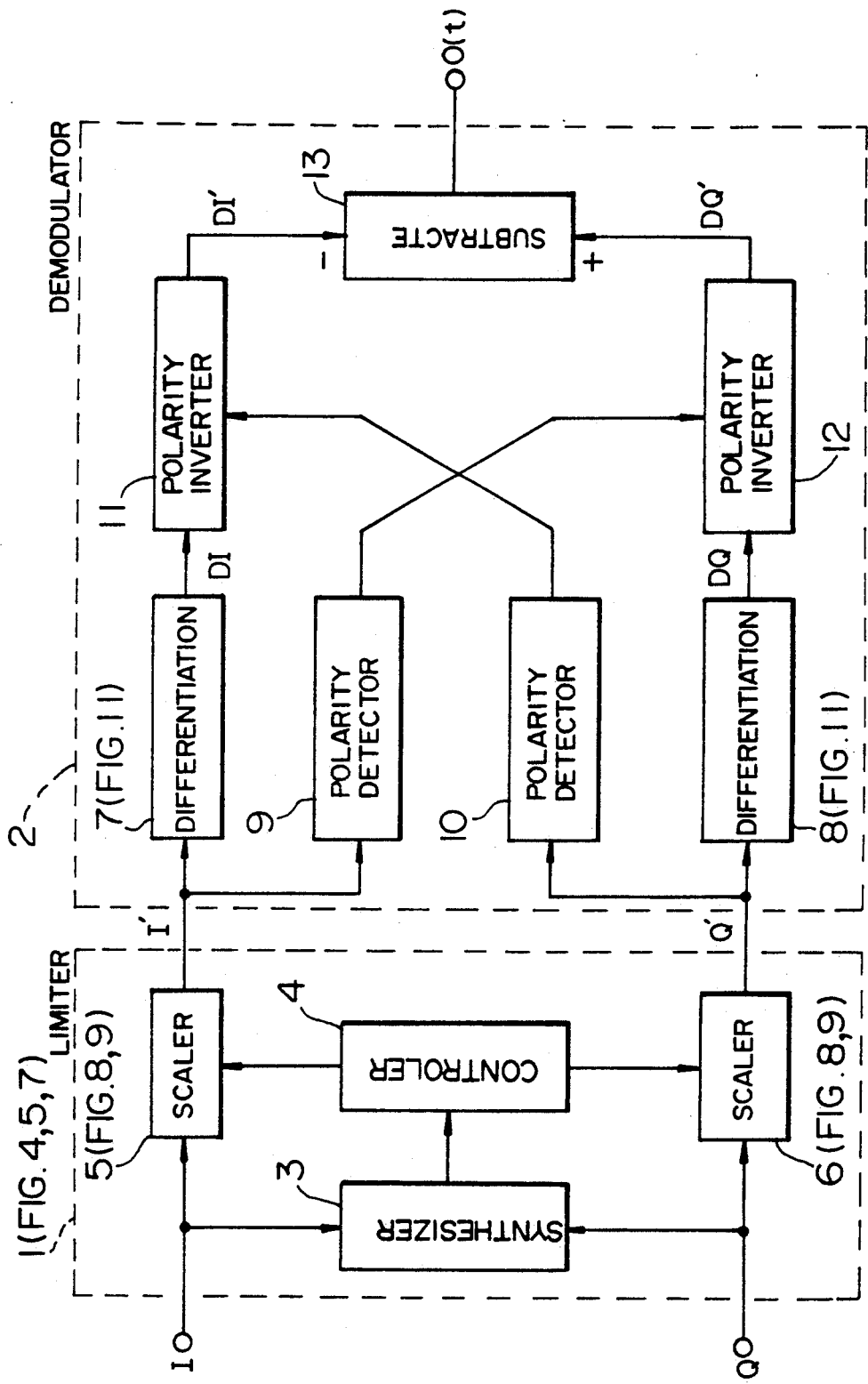
FIG. 1 is a constructional block diagram of an embodiment of a demodulator according to the invention.
Figure 2:
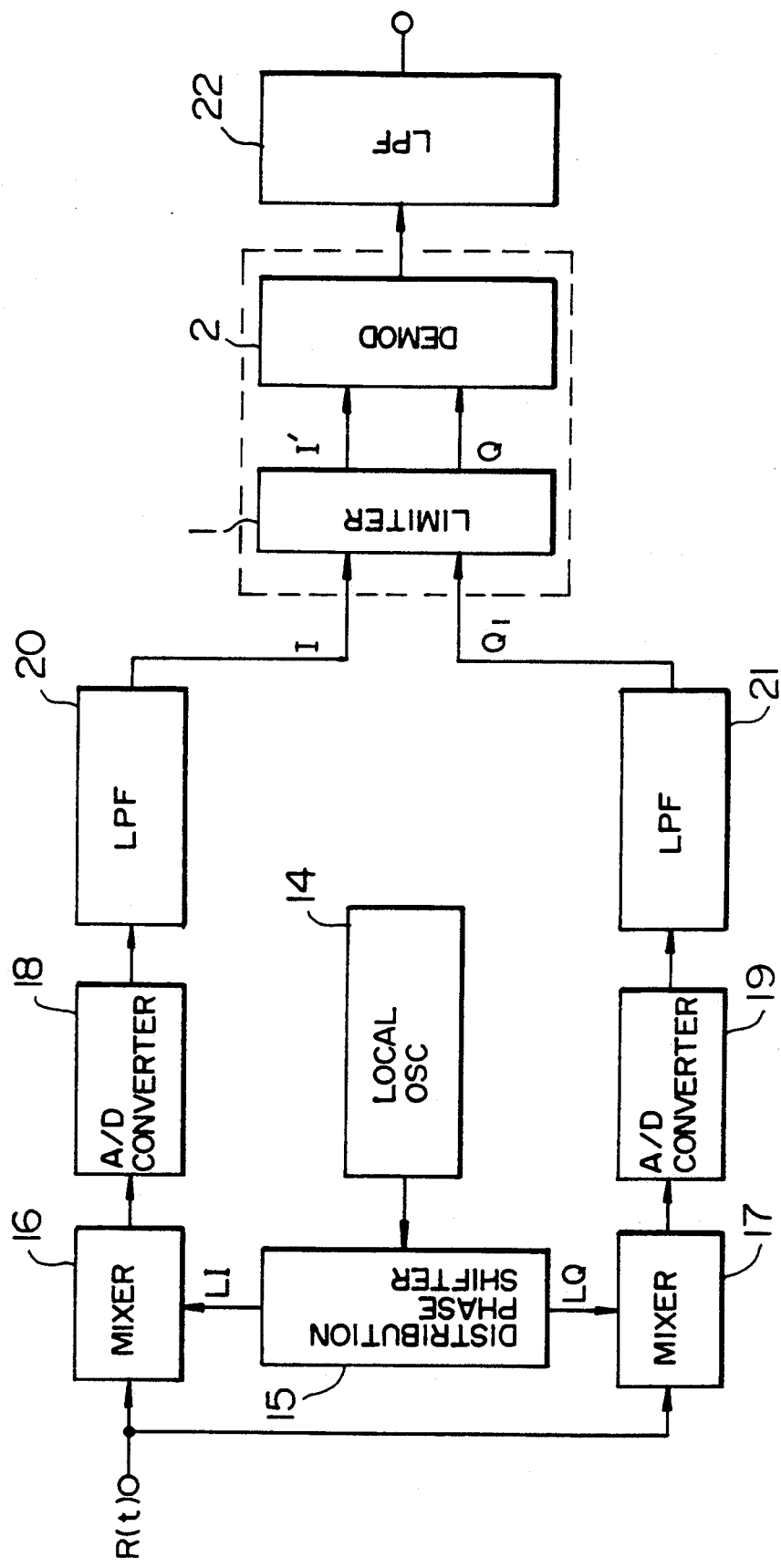
FIG. 2 is a functional block diagram of a direct detection receiver.
Figure 3:
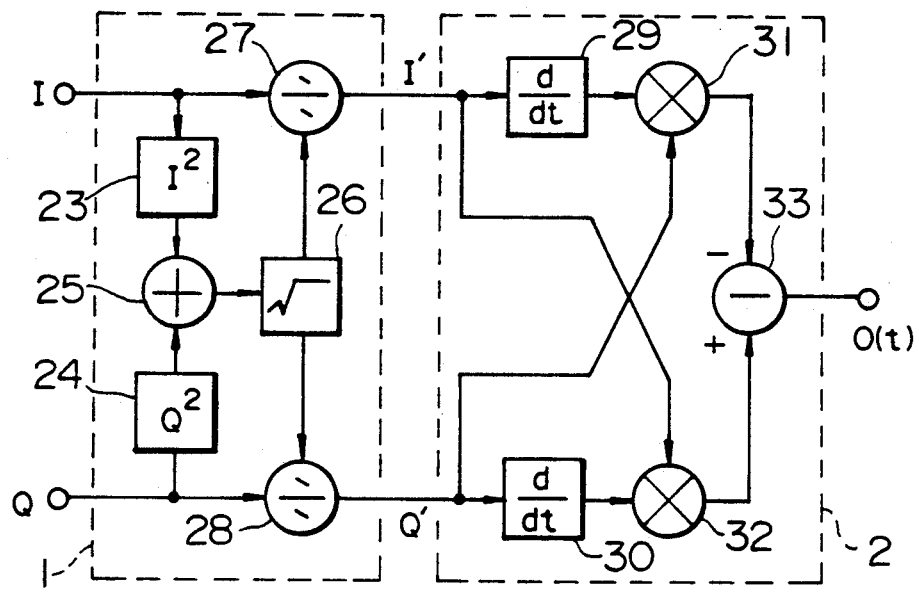
FIG. 3 is a general functional block diagram of the demodulator.

FIG. 1 is a constructional diagram of an embodiment of a demodulator according to the invention. The limiter 1 comprises: a synthesizer 3 to obtain a synthetic wave of an I signal and a Q signal; two scalers 5 and 6 to apply an amplitude limitation to the I and Q signals; and a controller 4 to control the scalers 5 and 6 in accordance with an output from the synthesizer 3. The demodulator 2 comprises: two differentiators 7 and 8 to obtain differentiated values of an I' signal and a Q' signal as output signals of the scalers 5 and 6 of the limiter 1; two polarity detectors 9 and 10 to detect the polarities of the I' and Q' signals and determine the operations of polarity inverters; two polarity inverters 11 and 12 to change the polarities of the differentiated values of the I' and Q' signals in accordance with information from the polarity detectors 9 and 10; and a subtracter 13 to obtain a difference between output signals of the two polarity detectors.

Figure 4:
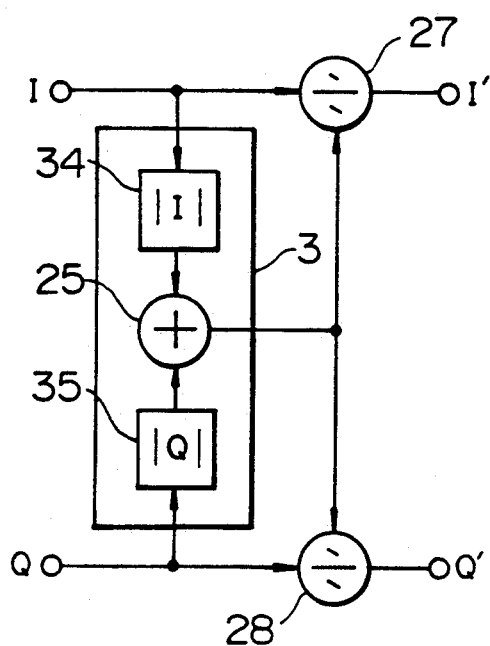
FIGS. 4, 5, and 7 are constructional diagrams of embodiments of a limiter of the demodulator according to the invention.
Figure 5:
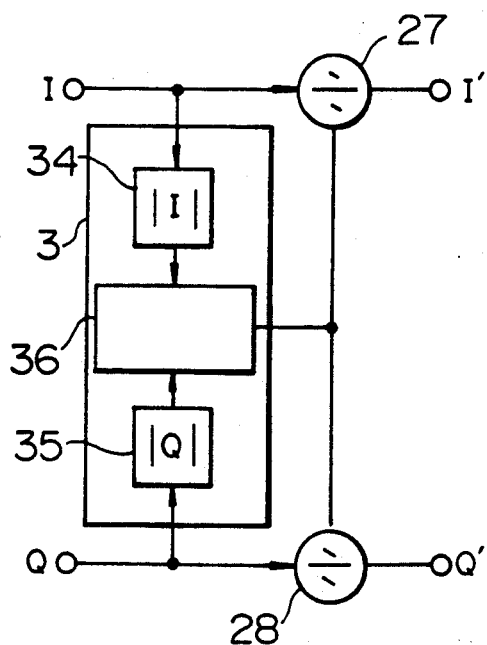

FIG. 4 is a constructional diagram of the embodiment of the limiter 1 which is constructed on the basis of the equations (11) and (12). The limiter comprises the synthesizer 3 and the two dividers 27 and 28. The synthesizer 3 comprises two absolute value calculators 34 and 35 and the adder 25 from the equations (11) and (12). The two dividers 27 and 28 correspond to the scalers 5 and 6 in FIG. 1. Since the limiting operation is realized by the division, in the circuit construction of FIG. 4, the output signal of the synthesizer 3 is used as a divisor of each of the two dividers 27 and 28. Therefore, the devices corresponding to the controller 4 in FIG. 1 includes two dividers 27 and 28. The sum of absolute values of the input I signal and Q signal is obtained by the adder 25 and is used as a divisor of each of the dividers 27 and 28. The two dividers use the output signal of the synthesizer 3 as a divisor and apply an amplitude limitation to the I and Q signals. Thus, the amplitude limiting operations shown in the equations (11) and (12) are executed. FIG. 5 is a constructional diagram of an embodiment of the limiter 1 which is constructed on the basis of the equations (13) and (14) and differs from the limiter 1 of FIG. 4 with respect to the construction of the synthesizer 3. The synthesizer 3 in FIG. 5 comprises the two absolute value calculators 34 and 35 and a comparator 36 on the basis of the equations (13) and (14). The comparator 36 operates so as to select the larger one of the absolute values of the I and Q signals as outputs of the two absolute value calculators 34 and 35. The comparator 36 comprises: for instance, a subtracter to obtain a difference between two signals; the absolute values of the two signals on the basis of the polarity of the result of the difference; and a selector to output. The operation as a limiter is similar to that of the limiter shown in FIG. 4.

Figure 6A:
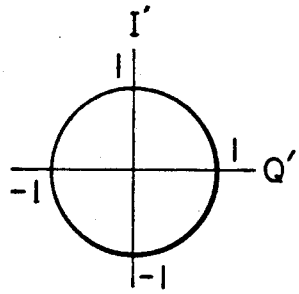
FIGS. 6A to 6C are correlation diagrams of two output signals in the limiters of FIGS. 3 to 5.
Figure 6B:
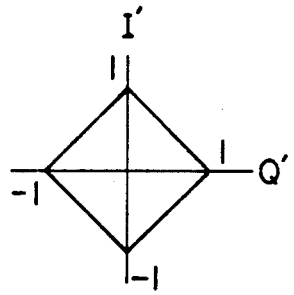
Figure 6C:
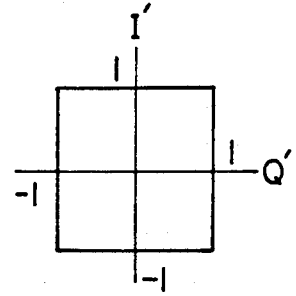

FIGS. 6a to 6C are diagrams showing the correlations between the outputs which are obtained by the ideal limiting operations shown in the equations (4) and (5) and the outputs which are derived by the limiting operations according to the approximate calculations shown in the equations (11) to (14). An axis of abscissa denotes the I' signal as a limiter output. An axis of ordinate indicates the Q' signal. FIG. 6A shows an ideal limiter output which is expressed by the equations (4) and (5) and a true circle is drawn. FIG. 6B shows a limiter output which is expressed by the equations (11) and (12) and a rhombus is drawn. FIG. 6C shows a limiter output which is expressed by the equations (13) and (14) and a square is drawn. If the absolute values are eliminated, the shape of FIG. 6C is fundamentally the same as that of FIG. 6B because FIG. 6C is derived by rotating the relative phases of the I' and Q' signals in FIG. 6B by 45°. For the ideal characteristics of FIG. 6A, a deviation from the true circle corresponds to an error of the approximate calculation of FIG. 6B or 6C. As mentioned above, the limiters shown in FIGS. 4 and 5 need the dividers.

Figure 7:
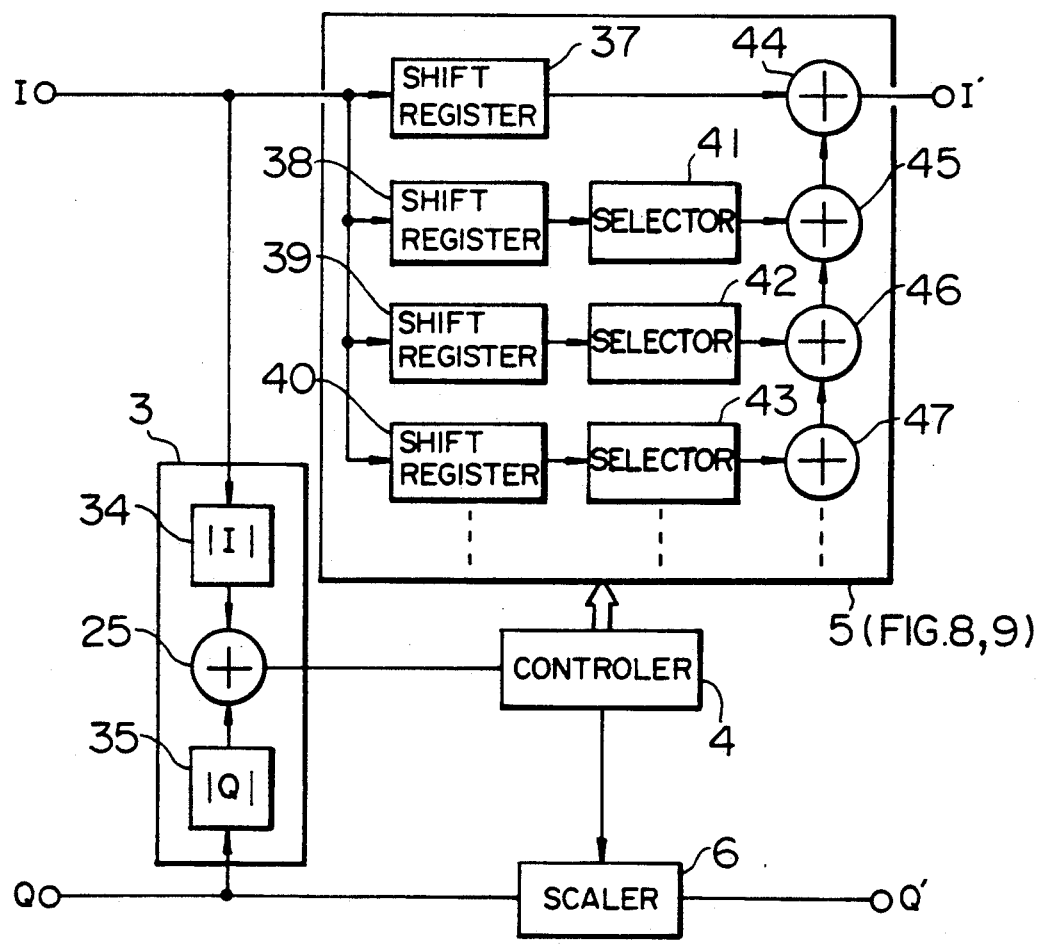

FIG. 7 shows a construction of another embodiment of a limiter. In the embodiment, the scalers 5 and 6 are constructed without using any divider. The limiter of FIG. 7 comprises: the synthesizer 3 which is constructed by an absolute value sum calculator; the two scalers 5 and 6; and the controller 4. The synthesizer 3 operates in a manner similar to the synthesizer 3 shown in FIG. 4 and obtains the sum of the absolute values of the input I and Q signals. Each of the two scalers 5 and 6 executes the processors of the equations (16), (11), and (12) to the I and Q signals and performs the limiting operation.

In the scaler 5 in FIG. 7, the operations until the fourth term of the right side of the equation (16) are shown. The scaler 5 comprises: four shift registers 37 to 40; three selectors 41 to 43; and four adders 44 to 47. In FIG. 7, it is assumed that each term of the right side of the equation (16) is allocated from the upper stage of the scaler. The controller 4 obtains a value of k in the equation (16) on the basis of the equation (16) in accordance with the output of the synthesizer 3 and sets shift amounts of the shift registers 37 to 40. That is, a bit shift amount of the shift register 37 is set to k. The bit shift amount is sequentially increased one bit by one and the bit shift amount of the shift register 40 is set to k+3. Further, the controller 4 controls the selectors 41 to 43 in accordance with a value of $A_x$ of the second and subsequent terms of the right side of the equation (16). For instance, if $A_1=1$, $1-A_1=0$ and the selector 41 is closed. If $A_2=0$, the selector 42 is opened and the I signal which was bit-shifted is input to the adder 46 at the next stage. The controller 4 also executes the similar control to the scaler 6. Another method of constructing the scalers 5 and 6 in FIG. 7, if the input signal I is the parallel data, for instance, is that the shift registers 37 to 40 are constructed by a single parallel data latch circuit and tap positions to take out outputs are deviated one bit by one. Due to this, the circuit scale of the shift register section can be reduced. On the other hand, it will be obviously understood that the synthesizer 3 in FIG. 5 can be used in place of the synthesizer 3.

Figure 8:
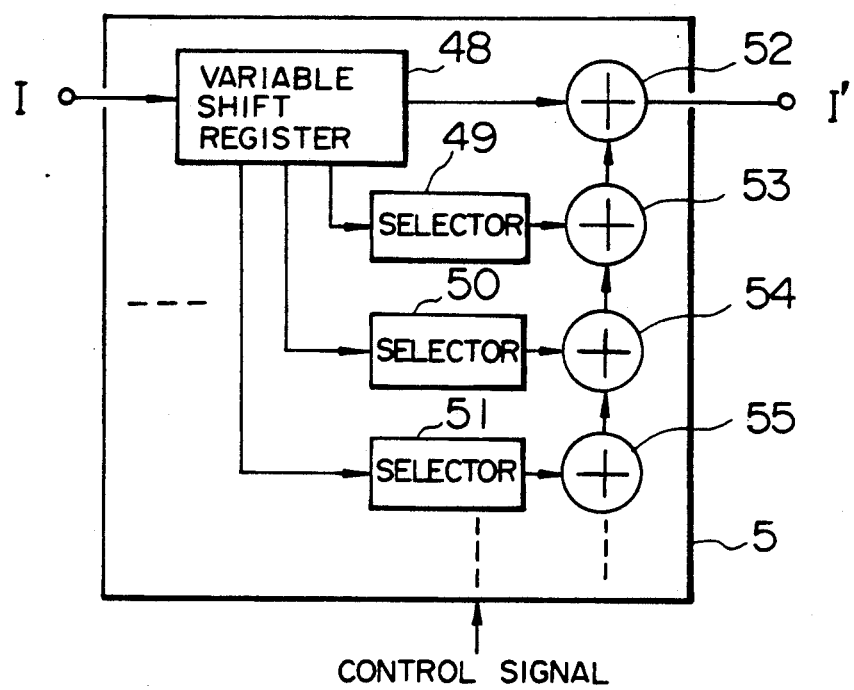
FIGS. 8 and 9 are constructional diagrams of embodiments of a scaler which is used in the demodulator according to the invention.

FIG. 8 is a diagram showing a construction of another embodiment of the scaler 5. The embodiment is used in the case where the I signal or the Q signal is serial data. The fundamental operations of selectors 49 to 51 and adders 52 to 55 are similar to those of the selectors 41 to 43 and the adders 44 to 47 shown in FIG. 7 except that parallel data is handled as signals. A variable shift register 48 is provided for the shift registers and the shift amounts are switched in accordance with the signal from the controller. Output bits outputted to the selectors 49 to 51 are sequentially shifted one bit by one to the adder 52 on the basis of the equation (16). Due to this, the circuit scale of the shift register section can be reduced.

Figure 9:
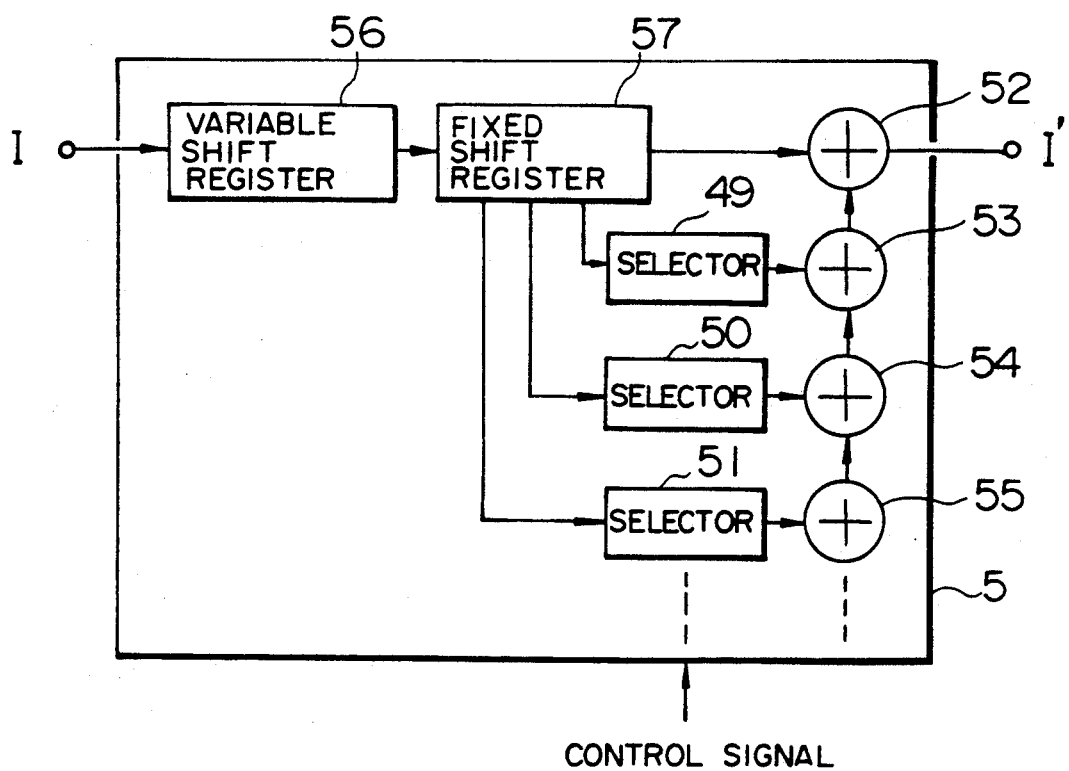

Further, FIG. 9 shows a construction of an embodiment of the scaler 5 which can reduce the circuit scale. The construction of FIG. 9 is used in the case where the I and Q signals are serial data. A variable shift register 56 executes the first scaling process to the I signal. The bit shift amount in the variable shift register 56 is switched in accordance with the information from the synthesizer 3 and the controller 4. The fundamental operations of a fixed shift register 57, the selectors 49 to 51, and the adders 52 to 55 are similar to those of the scaler 5 shown in FIG. 8. However, a length of the shift register 57 is fixed and the bit shifting process corresponding to the value of k mentioned above can change the circuit scale and the output data length in accordance with the distribution of the bits to the variable shift register 56 and the fixed shift register 57.

A circuit including the variable shift register 56 shown in FIG. 9 is the simplest scaler circuit. In this case, the circuit corresponds to that the approximate calculation is executed by using only the first term, that is, $2^k$ of the right side of the equation (16). FIGS. 10A and 10B show the relations between the limiter output signals I' and Q' in the above case.

FIG. 10A is a diagram showing the relation between the limiter output signals I' and Q' in the case where D in the approximate equation (16) is set to $D = |I(t)| + |Q(t)|$. FIG. 10B is a diagram showing the relation between the limiter output signals I' and Q' in the case where $D = M(|I(t)| + |Q(t)|)$. Since both of the circuit constructions of FIGS. 10A and 10B do not use any divider, variations of the limiter output signals I' and Q' are determined by the number of terms of the right side which are used in the equation (16). For instance, if the simplest circuit construction is used by using only the first term of the right side of the equation (16), an accuracy of the output signal is equal to 50% as shown by a hatched region in FIG. 10. On the other hand, if the terms until the second term of the right side of the equation (16) are used, the accuracy is equal to 75%. However, the circuit scale eventually increases. Therefore, the construction is determined in consideration of the circuit scale and the accuracy.

The demodulator 2 will now be described. In the demodulator 2 shown in FIG. 1, each of the differentiators 7 and 8 is constructed by the difference circuit shown in FIG. 11 on the basis of the equations (17) and (18). In FIG. 11, a delay circuit 58 is constructed by a shift register and delays an input signal by a time of one sample. If the input signal is serial data, the delay circuit 58 is constructed by shift registers of the number corresponding to one word. If the input signal is parallel data, the delay circuit 58 is constructed by one shift register of the bits corresponding to one word. A subtracter 59 is constructed by an adder. The processes corresponding to the equations (18) and (19) are executed to the I' and Q' signals by the differentiators 7 and 8, so that DI and DQ signals are output. Each of the polarity detectors 9 and 10 is constructed by a circuit for holding the polarity bit of the input signal. In this case, if data has a complement indication of 2, when the input data is positive, the output is set to 0. On the contrary, if the input data is negative, the output is set to 1. Therefore, the results obtained by the polarity detectors 9 and 10 correspond to P(I') and P(Q') in the equations (20) and (21). However, in the equations (20) and (21), P(I') and P(Q') are equal to 1 or −1. The polarity inverters 11 and 12 invert the polarities of the DI and DQ signals in accordance with the data from the polarity detectors 9 and 10. As mentioned above, the processes are executed in accordance with a combination of the circuit A in the table shown in FIG. 12. For example, if the polarity of the Q' signal is positive and the output of the polarity detector 10 is equal to 0, the polarity inverter 11 directly outputs the input DI signal as a DI' signal. On the other hand, if the polarity of the Q' signal is negative and the output of the polarity detector is equal to 1, the polarity inverter 11 inverts the polarity of the input DI signal and outputs as a DI' signal. A practical method of inverting the polarity is similar to the method which is used in the absolute value calculators 34 and 35 mentioned above. Due to this, the processes corresponding to the above equations (20) and (21) are executed by the polarity inverters 11 and 12, so that the DI' and DQ' signals are derived. Finally, by obtaining a difference between the DQ' and DI' signals by the subtracter 13, the process corresponding to the equation (22) is performed, so that the O(t) signal is obtained as a demodulation output. A typical example of the subtracter 13 is constructed by a combination of the polarity inverter and the adder. It is advantageous to construct the subtracter 13 by only the adders in consideration of the reduction of the circuit scale.

In the demodulator of the embodiment, since the polarity inverter 11 is provided before the subtracter 13, by executing the operation of the polarity inverter 11 in a manner opposite to the above operation, the subtracter 13 can be constructed by only the adders. That is, when the Q' signal is positive and the output of the polarity detector 10 is equal to 0, it is sufficient to invert the polarity of the DI signal by the polarity inverter 11. On the other hand, when the Q' signal is negative and the output of the polarity detector 10 is equal to 1, it is sufficient not to change the polarity of the DI signal by the polarity inverter 11. Or, such a process can be also realized by equalizing the operations of the polarity inverters 11 and 12 and by reversing the operations of the polarity detectors 9 and 10, that is, by setting the output condition of the polarity detector 10 so as to be opposite to that of the polarity detector 9. Due to this, the operations of the demodulator for the DI and DQ signals are executed in accordance with a combination of the circuit B in the table shown in FIG. 12. The subtracter 13 can be replaced to the adder.

Since the practical constructions of the adders, shift registers, selectors, comparators, and the like which are used in the construction of the embodiment are the circuits which have conventionally been well known, their detailed descriptions are omitted.

According to the invention, in the direct detecting method of the angle modulated reception signal, the number of multipliers which construct the demodulator can be remarkably reduced. Therefore, in the case of constructing the demodulator by an IC, the number of component devices is reduced and the electric power consumption is reduced. The demodulator of the invention is effective means when it is applied to a small receiver such as a portable radio receiver or the like.

The fundamental operations of the two kinds of synthesizers which are used in the invention with respect to the limiter are similar and the circuit scale can be reduced by the approximate calculations. On the other hand, there is a degree of freedom when the circuit is constructed. The limiter according to the required processing accuracy and circuit scale can be constructed.

The fundamental operations of the two kinds of circuit constructions regarding the demodulator are similar. Both of the circuit scales can be reduced by the invention, so that an electric power consumption can be reduced.

We claim:

1. A demodulating apparatus for demodulating first and second digital signals which are produced from a received angle modulated wave and whose phases are mutually orthogonal, comprising:

a limiter for executing an amplitude limitation to each of the first and second digital signals; and a demodulator for demodulating by using an output signal from the limiter, wherein the limiter is constructed by a first circuit for obtaining absolute values of the first and second digital signals, a second circuit for outputting a result of a predetermined process of the first and second absolute values which are output from the first circuit, a controller for producing a control signal according to an output of the second circuit, and scalers which change amplitudes of the first and second digital signals in accordance with the control signal and which do not include a multiplier therein.

2. An apparatus according to claim 1, wherein the scaler includes:

a plurality of shift registers for temporarily storing the first and second digital signals, bit shift amounts of said shift registers behind different;

a plurality of selectors which are connected to said shift registers and which are on/off controlled in accordance with the control signal; and a plurality of adders which are connected to said selectors and in which each adder adds an output from the selector connected to said adder and an output of the other adder.

3. An apparatus according to claim 1, wherein said scalers include a plurality of scaling circuit, and each of the scaling circuits executes a scaling process in accordance with information from the controller and processes lower bits of an output and sets the number of bits of output data to a constant value and outputs the data as an input signal to the scaling circuit at the next stage.

4. An apparatus according to claim 1, wherein the first circuit is constructed by polarity detectors for obtaining polarities of the first and second digital signals from the first and second digital signals and polarity inverters for obtaining the first and second absolute values by inverting the polarities of the first and second digital signals in accordance with the detected polarities of the first and second digital signals, and the second circuit is constructed by a synthesizer for outputting the sum of the first and second absolute values.

5. An apparatus according to claim 1, wherein the first circuit is constructed by polarity detectors for obtaining polarities of the first and second digital signals from the first and second digital signals and polarity inverters for obtaining the first and second absolute values by inverting the polarities of the first and second digital signals in accordance with the detected polarities of the first and second digital signals, and the second circuit is constructed by a circuit for outputting either larger one of the first and second absolute values.

6. An apparatus according to claim 5, wherein the scalers operate in a manner such that at least one of the amplitudes of the first and second digital signals becomes almost constant in accordance with the control signal.

7. An apparatus according to claim 1, wherein the demodulator comprises:

first and second polarity detectors for detecting polarities of the first and second digital signals whose amplitudes were limited by the limiter, respectively;

first and second differentiators for differentiating the first and second amplitude limited digital signals, respectively;

a first polarity inverter for changing the polarity of an output of the first differentiator by an output of the second polarity detector;

a second polarity inverter for changing the polarity of an output of the second differentiator by an output of the first polarity detector; and a subtracter for outputting a difference between the outputs of the first and second polarity detectors as a demodulation signal.

8. A radio receiver for demodulating a received angle modulated wave signal into an original signal, comprising:

a circuit for producing first and second digital signals whose phases are mutually orthogonal from the received angle modulated wave;

a limiter for executing an amplitude limitation to the first and second digital signals, respectively; and a demodulator for demodulating by using an output signal from the limiter, wherein the limiter is constructed by a first circuit for obtaining absolute values of the first and second digital signals, a second circuit for outputting a result of a predetermined process of the first and second absolute values which are output from the first circuit, a controller for producing a control signal according to an output of the second circuit, and scalers which change amplitudes of the first and second digital signals in accordance with the control signal and do not include a multiplier therein.

9. A radio receiver according to claim 8, wherein the scaler includes:

a plurality of shift registers for temporarily storing the first and second digital signals, bit shift amounts of the shift registers being different;

a plurality of selectors which are connected to the shift registers and are on/off controlled in accordance with the control signal; and a plurality of adders which are connected to the selectors and each of which adds an output from the selector connected to said adder and an output of the other adder.

10. A radio receiver according to claim 8, wherein said scalers include a plurality of scaling circuits, and each of the scaling circuits executes a scaling process in accordance with information from the controller and processes lower bits of an output and sets the number of bits of output data to a constant value and outputs the data as an input signal to the scaling circuit at the next stage.

11. A radio receiver according to claim 8, wherein the first circuit is constructed by polarity detectors for obtaining polarities of the first and second digital signals from the first and second digital signals and polarity inverters for obtaining the first and second absolute values by inverting the polarities of the first and second digital signals in accordance with the detected polarities of the first and second digital signals, and the second circuit is constructed by a synthesizer to output the sum of the first and second absolute values.

12. A radio receiver according to claim 8, wherein the first circuit is constructed by polarity detectors for obtaining polarities of the first and second digital signals from the first and second digital signals and polarity inverters for obtaining the first and second absolute values by inverting the polarities of the first and second digital signals in accordance with the detected polarities of the first and second digital signals, and the second circuit is constructed by a circuit for outputting either larger one of the first and second absolute values.

13. A radio receiver according to claim 8, wherein the scalers operate in a manner such that at least one of the amplitudes of the first and second digital signals becomes almost constant in accordance with the control signal.

14. A radio receiver according to claim 8, wherein the demodulator comprises:

first and second polarity detectors for detecting polarities of the first and second digital signals whose amplitudes were limited by the limiter, respectively;

first and second differentiators for differentiating the first and second amplitude limited digital signals, respectively;

a first polarity inverter for changing the polarity of an output of the first differentiator by an output of the second polarity detector;

a second polarity inverter for changing the polarity of an output of the second differentiator by an output of the first polarity detector; and a subtracter for outputting a difference between the outputs of the first and second polarity detectors as a demodulation signal.

* * * * *